United States Patent
Ahn et al.

(10) Patent No.: US 10,886,501 B2
(45) Date of Patent: *Jan. 5, 2021

(54) GRAPHENE PROTECTIVE FILM SERVING AS A GAS AND MOISTURE BARRIER, METHOD FOR FORMING SAME, AND USE THEREOF

(75) Inventors: Jonghyun Ahn, Suwon-si (KR); Byung Hee Hong, Seoul (KR); Youngbin Lee, Suwon-si (KR); Hyeong Keun Kim, Hwaseong-si (KR); Su Kang Bae, Suwon-si (KR)

(73) Assignee: Graphene Square, Inc., Seoul (KR)

( * ) Notice: Subject to any disclaimer, the term of this patent is extended or adjusted under 35 U.S.C. 154(b) by 270 days.

This patent is subject to a terminal disclaimer.

(21) Appl. No.: 13/548,680

(22) Filed: Jul. 13, 2012

(65) Prior Publication Data

US 2012/0282419 A1   Nov. 8, 2012

Related U.S. Application Data

(63) Continuation of application No. PCT/KR2011/000258, filed on Jan. 13, 2011.

(30) Foreign Application Priority Data

Jan. 15, 2010 (KR) .................. 10-2010-0004007

(51) Int. Cl.
*B32B 1/02* (2006.01)
*B32B 15/04* (2006.01)
(Continued)

(52) U.S. Cl.
CPC .......... *H01L 51/5253* (2013.01); *B82Y 30/00* (2013.01); *B82Y 40/00* (2013.01);
(Continued)

(58) Field of Classification Search
CPC ........... Y10T 428/31678; Y10T 428/30; Y10T 428/1324; B82Y 30/00; B82Y 40/00;
(Continued)

(56) References Cited

U.S. PATENT DOCUMENTS

| RE40,531 E | * | 10/2008 | Graff ....................... B32B 27/00 426/126 |
| 2007/0284557 A1 | * | 12/2007 | Gruner .................. B82Y 30/00 252/500 |

(Continued)

FOREIGN PATENT DOCUMENTS

| JP | H07-246668 A | 9/1995 |
| JP | 2000-269530 | 9/2000 |

(Continued)

OTHER PUBLICATIONS

PCS (Paralyene Coating Services, "What is paraylene | Types of paraylene | Paraylene coating services," http://www.paryleneinc.com/faq.php, p. 1-2, accessed Nov. 1, 2017). (Year: 2017).*

(Continued)

*Primary Examiner* — Gerard Higgins
*Assistant Examiner* — Kevin C Ortman, Jr.
(74) *Attorney, Agent, or Firm* — Greer, Burns & Crain, Ltd.

(57) ABSTRACT

The present invention relates to a method for forming a graphene protective film having gas and moisture barrier properties, to a graphene protective film formed by the method, and to the use thereof. A single-layer or multilayer graphene protective film can be used as a material for a barrier coating or bags, and improves the gas and moisture barrier properties of a variety of devices in a wide array of industrial fields to thereby maintain the electrical characteristics of devices over a long period of time.

12 Claims, 16 Drawing Sheets

(51) Int. Cl.

| | | |
|---|---|---|
| *B32B 38/10* | (2006.01) | |
| *B32B 9/00* | (2006.01) | |
| *H01L 51/52* | (2006.01) | |
| *B82Y 30/00* | (2011.01) | |
| *H01L 51/44* | (2006.01) | |
| *B82Y 40/00* | (2011.01) | |
| *H01L 31/048* | (2014.01) | |
| *C01B 32/184* | (2017.01) | |
| *C01B 32/194* | (2017.01) | |
| *C01B 32/186* | (2017.01) | |

(52) U.S. Cl.
CPC .......... *C01B 32/184* (2017.08); *C01B 32/186* (2017.08); *C01B 32/194* (2017.08); *H01L 31/048* (2013.01); *H01L 51/448* (2013.01); *C01B 2204/02* (2013.01); *C01B 2204/04* (2013.01); *H01L 51/5256* (2013.01); *H01L 2251/5338* (2013.01); *Y02E 10/549* (2013.01); *Y10T 428/1324* (2015.01); *Y10T 428/30* (2015.01); *Y10T 428/31678* (2015.04)

(58) Field of Classification Search
CPC ............ C01B 2204/02; C01B 31/0446; C01B 31/0453; C01B 31/0484; C01B 2204/00; H01L 2251/5338; H01L 51/5253; H01L 31/048; H01L 51/448; Y02E 10/549
USPC ..... 428/34.8, 35.7, 35.8, 457, 688; 156/236, 156/249
See application file for complete search history.

(56) References Cited

U.S. PATENT DOCUMENTS

| | | | |
|---|---|---|---|
| 2008/0312088 A1 | 12/2008 | Chung et al. | |
| 2009/0071533 A1* | 3/2009 | Choi ...................... | B82Y 20/00 136/252 |
| 2009/0140801 A1 | 6/2009 | Barbaros et al. | |
| 2009/0146111 A1 | 6/2009 | Shin et al. | |
| 2010/0092809 A1* | 4/2010 | Drzal et al. ...................... | 429/12 |
| 2011/0189452 A1* | 8/2011 | Lettow ...................... | B05D 3/10 428/220 |

FOREIGN PATENT DOCUMENTS

| | | |
|---|---|---|
| JP | 2007-335256 A | 12/2007 |
| JP | 2008-063196 | 3/2008 |
| JP | 2008-536710 | 9/2008 |
| JP | 2009-062247 A | 3/2009 |
| JP | 2009-107921 | 5/2009 |
| JP | 2009-143761 | 7/2009 |
| JP | 2009-188007 | 8/2009 |
| JP | 2011-503243 | 1/2011 |
| KR | 10-2009-0028007 A | 3/2009 |
| KR | 10-2009-0051439 | 5/2009 |
| KR | 10-2009-0056117 A | 6/2009 |
| KR | 10-2009-0086199 A | 8/2009 |
| KR | 10-1262327 | 5/2013 |
| WO | WO 2008/108383 A1 | 9/2008 |

OTHER PUBLICATIONS

COTW (COTW, "Colors on the web," http://www.colorsontheweb.com/Color-Theory/Color-Physics, p. 1-3, accessed Nov. 1, 2017). (Year: 2017).*

International Search Report of PCT/KR2011/000258 dated Sep. 26, 2011 (6 pages, including English language translation).

Xuesong Li et al., "Large-Area Synthesis of High-Quality and Uniform Graphene Films on Copper Foils," Science, Jun. 2009 vol. 324, pp. 1312-1314 (3 pages, in English).

Keun Soo Kim et al., "Large-Scale Pattern Growth of Graphene Films for Stretchable Transparent Electrodes," Natures Letters, Feb. 2009, vol. 457, pp. 706-710 (5 pages, in English).

Goki Eda et al., "Large-Area Ultrathin Films of Reduced Graphene Oxide as a Transparent and Flexible Electronic Material," Nature Nanotechnology, May 2008, vol. 3, pp. 270-274 (5 pages, in English).

Keun Soo Kim et al., "Large-scale pattern growth of graphene films for stretchable transparent electrodes", Nature, vol. 457, pp. 706-710; Feb. 5, 2009.

Japanese office action issued in corresponding Japanese App. No. 2012-534122, dated Sep. 24, 2012 (with translation) to U.S. Appl. No. 13/447,548.

Chinese office action issued in counterpart Chinese App. No. 201080053934.1, dated Dec. 2, 2013 (with translation) to U.S. Appl. No. 13/447,548.

Soppe et al.; "Roll to Roll Fabrication Process of Thin-Film Silicon Solar Cells on Steel Foil"; 24th European Photovoltaic Solar Energy Conference and Exhibition; pp. 21-25; Sep. 21, 2009.

Ahn et al.; "High-Speed Roll to Roll Nanoimprint Lithography on Flexible Plastic Substrates"; Advanced Materials, pp. 2044-2049; Dec. 31, 2008.

Reina et al., "Large Area, Few-Layer Graphene Films on Arbitrary Substrates by Chemical Vapor Deposition", Nano letters 2009; Dec. 1, 2008; pp. 30-35.

Bae, et al., "Roll-to-roll production of 30-inch graphene films for transparent electrodes," Nature Nanotechnology, vol. 5, Aug. 2010; Published online Jun. 20, 2010; pp. 574-578 (in English, 5 pages).

Final office action issued in U.S. Appl. No. 13/447,548, dated Feb. 4, 2014.

Non-final office action issued in U.S. Appl. No. 13/447,548, dated Jul. 23, 2013.

Kim, Keun Soo et al., "Large-scale pattern growth of graphene films for stretchable transparent electrodes", Nature, vol. 457, Feb. 5, 2009 (5 pages).

* cited by examiner

GRAPHENE PROTECTIVE FILM SERVING AS A GAS AND MOISTURE BARRIER, METHOD FOR FORMING SAME, AND USE THEREOF

CROSS-REFERENCE TO RELATED APPLICATION

This application is a Continuation of International Application No. PCT/KR2011/000258 filed on Jan. 13, 2011, which claims the benefits of Korean Patent Application No. 10-2010-0004007 filed on Jan. 15, 2010. The entire disclosure of the prior application is incorporated herein by reference in its entirety.

TECHNICAL FIELD

The present disclosure relates to a forming method of a graphene protective film having a gas and moisture blocking property, a graphene protective film produced by the method, and use thereof. The graphene protective film can be applied to various fields such as flexible substrates, e.g., plastics, food and beverage containers, and organic light emitting diodes.

BACKGROUND ART

In general, a device such as an organic solar cell, organic light emitting diodes (OLED), or the like is produced on a plastic substrate. When the device on the substrate is exposed to oxygen and moisture, the device is rapidly degraded. If oxygen and moisture easily penetrate a plastic substrate, the life of the device may be drastically reduced. In order to prevent related devices or component materials from being degraded by oxygen or moisture, the penetration of oxygen and moisture through the substrate needs to be reduced or removed. Such necessity is identically applied to the fields of medicine and medical supplies or food and beverages, which are sensitive to oxygen and moisture.

In order to obtain required resistance of the plastic substrate against moisture and oxygen, the substrate should be coated with a protective film so as to have maximum oxygen transmittance of from $10^{-4}$ cc/m$^2$/1 day to $10^{-2}$ cc/m$^2$/1 day and maximum moisture transmittance of from $10^{-5}$ cc/m$^2$/1 day to $10^{-6}$ cc/m$^2$/1 day.

Many gas and moisture barrier film materials have been developed over the past decades. In order to improve the characteristic of the gas and moisture barrier film, a method of stacking organic and inorganic materials such as $Al_2O_3$/polyacrylate, SiON/silicone, or SiN/parylene on a plastic substrate has been developed. However, since the method of stacking multiple layers on a device basically requires a vacuum process, the method results in a high cost production process. If an inorganic material is used, a mechanical characteristic of the substrate is deteriorated. Thus, the resulting film and substrate are vulnerable to environmental factors such as heat, moisture, and oxygen.

DISCLOSURE OF THE INVENTION

Problems to Be Solved by the Invention

In order to resolve the above-described problems, the present disclosure provides a graphene protective film, which improves a gas and moisture blocking property so as to maintain high stability, good durability and an excellent electrical characteristic of a device for a long time.

However, problems sought to be resolved by the present disclosure are not limited to the above-described problems. Other problems, which are sought to be resolved by the present disclosure but are not described herein, can be clearly understood by those skilled in the art from the descriptions below.

Means for Solving the Problems

In order to achieve the above-described object, one aspect of the present disclosure provides a forming method of a graphene protective film serving as a gas and moisture barrier, comprising: producing a graphene film on a substrate by supplying heat and a reaction gas containing a carbon source to the substrate; and transferring the graphene film on a flexible substrate by a dry process, a wet process, or a roll-to-roll process to coat the flexible substrate.

Another aspect of the present disclosure provides a flexible barrier sheet comprising a graphene protective film serving as a gas and moisture barrier including a graphene film formed on a flexible substrate.

Still another aspect of the present disclosure provides an item comprising a flexible barrier sheet including a graphene protective film serving as a gas and moisture barrier including the graphene film formed on a flexible substrate.

Effect of the Invention

The graphene film serving as a protective film in the present disclosure has excellent characteristics such as adhesion to a plastic substrate, heat resistance, chemical resistance, and a mechanical characteristic, compared to other materials. Thus, the graphene film can be applied as a barrier coating material and a sealing material for blocking a gas and moisture in broad industrial fields. A device using the graphene film as a coating material or a sealing material can block a gas, moisture, or the like thereby maintaining a high electrical characteristic for a long time.

Since the forming method of the graphene protective film in the present disclosure can be performed under a condition of a normal pressure rather than vacuum, the method enables the formation of the protective film within a short time at low costs. The graphene protective film formed by the method is very thin having a thickness of less than several nm, lightweight, transparent, and excellent in flexibility and elasticity.

BEST MODE FOR CARRYING OUT THE INVENTION

Figure 1:
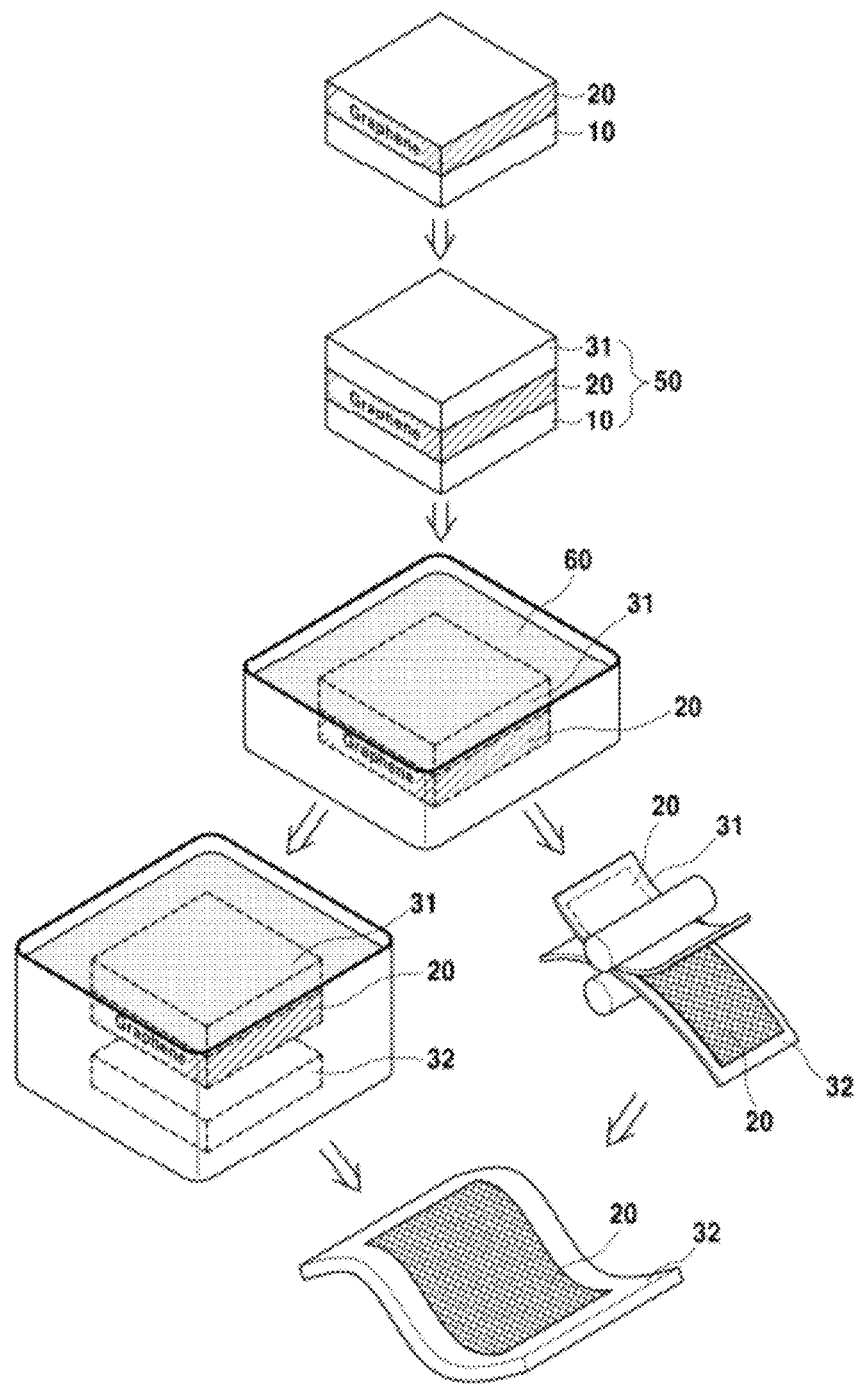
FIG. 1 is a diagram showing a process for forming a graphene protective film serving as a gas and moisture barrier in accordance with an illustrative embodiment of the present disclosure.
Figure 2:
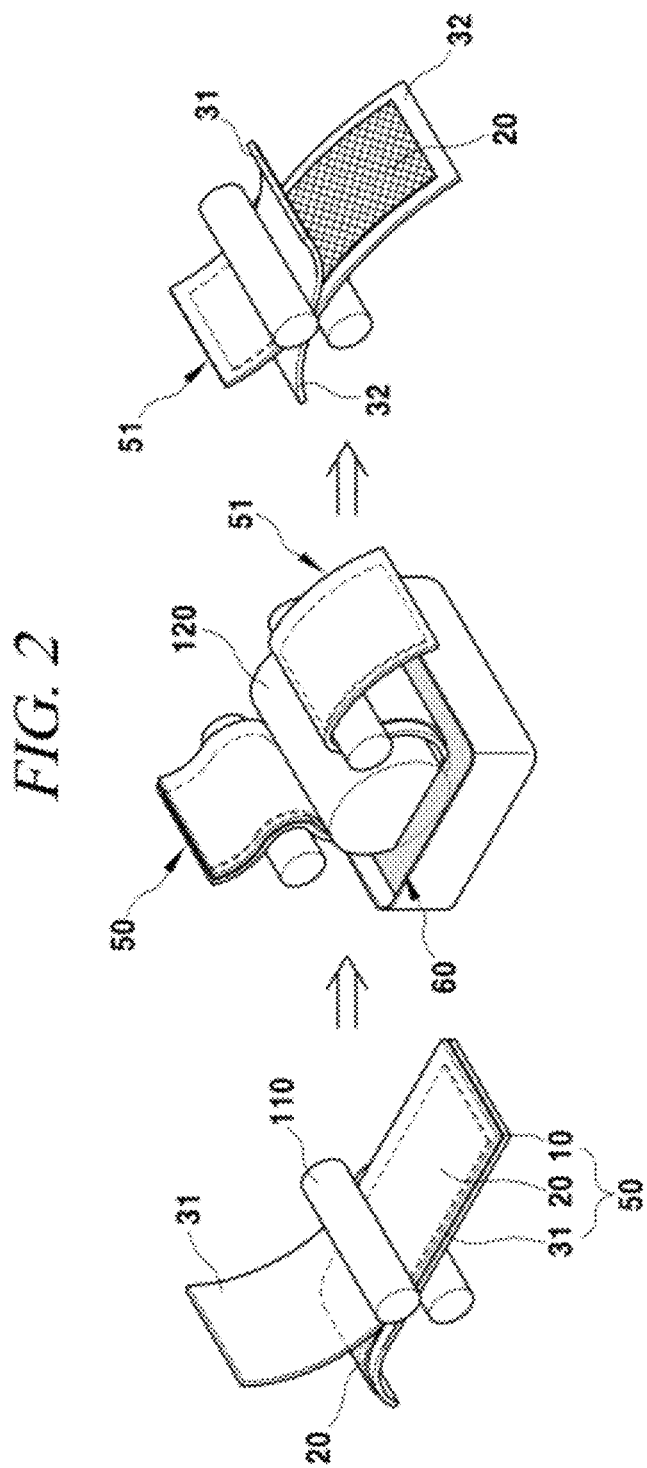
FIG. 2 is a diagram showing a process for transferring a large scale graphene film on a flexible substrate through a roll-to-roll process to coat the flexible substrate in accordance with an illustrative embodiment of the present disclosure.

Hereinafter, illustrative embodiments and examples of the present disclosure will be described in detail with reference to the accompanying drawings so that the present disclosure may be readily implemented by those skilled in the art.

However, it is to be noted that the present disclosure is not limited to the illustrative embodiments and the examples, and can be realized in various other ways. In the drawings, parts irrelevant to the description are omitted for the simplicity of explanation. Throughout the whole document, like reference numerals denote like parts.

Throughout the whole document, the term "on" that is used to designate a position of one element with respect to another element includes both a case that the one element is adjacent to the another element and a case that any other element exists between these two elements. Further, the term "comprises or includes" and/or "comprising or including" used in the document means that one or more other components, steps, operation and/or existence or addition of elements are not excluded in addition to the described components, steps, operation and/or elements unless context dictates otherwise.

Throughout the whole document, the terms "about or approximately" or "substantially" are intended to have meanings close to numerical values or ranges specified with an allowable error and intended to prevent accurate or absolute numerical values disclosed for understanding of the present invention from being illegally or unfairly used by any unconscionable third party. Through the whole document, the term "step of" does not mean "step for".

Throughout the whole document, the term "graphene film" means a layer or sheet form of graphene, in which multiple carbon atoms are covalently bonded to one another, thereby forming polycyclic aromatic molecules. The covalently bonded carbon atoms form a 6 circular ring as a basic repeat unit, but may further include 5 and/or 7 circular rings. Accordingly, the graphene layer appears to be a monolayer of the covalently bonded carbon atoms (in general, $sp^2$ bond). The graphene layer may have various structures. The structure of the graphene layer may vary depending on a content of the 5 and/or 7 circular rings that may be included in the graphene. The graphene layer may be formed of a monolayer of graphene as described above, but several graphene layers may be stacked, thereby forming multiple layers. In general, a side end part of the graphene may be saturated with hydrogen atoms.

Throughout the whole document, the term "roller unit" means a device in a roll-to-roll form, which is composed of one roller or multiple rollers, and is not limited with respect to a shape, a size, and/or arrangement of a roller.

A forming method of a graphene protective film serving as a gas and moisture barrier in accordance with one aspect of the present disclosure comprises: producing a graphene film on a substrate by supplying heat and a reaction gas containing a carbon source to the substrate; and transferring the produced graphene film onto a flexible substrate by a dry process, a wet process, or a roll-to-roll process to coat the flexible substrate. The graphene protective film has a gas and moisture blocking property and excellent characteristics such as adhesion to a plastic substrate, heat resistance, chemical resistance, and a mechanical characteristic, compared to other materials. Thus, the graphene protective film can be applied as a barrier coating material and a sealing material for blocking a gas and moisture in broad industrial fields.

In an illustrative embodiment, the flexible substrate may be a plastic substrate, a substrate for an organic light emitting diode (OLED), or a sheet for a food and beverage container. However, the present disclosure is not limited thereto. If the flexible substrate is a plastic substrate, unlimited examples of the plastic substrate may include substrates including polyimide, polyethersulfon, polyetheretherketone, polyethyleneterephthalate, polycarbonate, or combinations thereof. However, the present disclosure is not limited thereto.

In an illustrative embodiment, the roll-to-roll process may include: passing the graphene film formed on the substrate in contact with the flexible substrate through a first roller unit to form a layered structure including substrate-graphene film-flexible substrate; and immersing the layered structure in an etching solution and passing through the etching solution by using a second roller unit to remove or separate the substrate from the layered structure and simultaneously to transfer the graphene film on the flexible substrate to coat the flexible substrate with the graphene film. However, the present disclosure is not limited thereto.

In an illustrative embodiment, the wet process may include: selectively removing or separating only the substrate from the substrate, on which the graphene film is formed, by an etching solution to float the graphene film; and introducing the flexible substrate from an upper direction or a lower direction of the floated graphene film to transfer and coat the graphene film on the flexible substrate. However, the present disclosure is not limited thereto.

In an illustrative embodiment, a metal catalyst layer for forming a graphene may be formed on a surface of the substrate. However, the present disclosure is not limited thereto. The metal catalyst layer for forming a graphene is formed to facilitate growth of the graphene film. As unlimited examples, the metal catalyst layer may be at least one metal or alloy selected from the group consisting of Ni, Co, Fe, Pt, Au, Al, Cr, Cu, Mg, Mn, Mo, Rh, Si, Ta, Ti, W, U, V, Zr, brass, bronze, white brass, stainless steel, and Ge. However, the present disclosure is not limited thereto.

In an illustrative embodiment, forming an organic supporting layer on the graphene film formed on the substrate may be further included. However, the present disclosure is not limited thereto. If forming an organic supporting layer is further included, a process for removing the organic supporting layer from the graphene film may be further included after transferring the graphene film onto the flexible substrate to coat the flexible substrate with the graphene film. However, the present disclosure is not limited thereto. In an illustrative embodiment, the organic supporting layer may be a stamper or a thermal release tape. However, the present disclosure is not limited thereto.

In an illustrative embodiment, an adhesive layer may be formed on the flexible substrate. However, the present disclosure is not limited thereto. In an illustrative embodiment, the adhesive layer may include low density polyethylene, a low molecular polymer, or an ultraviolet(UV) or infrared ray(IR) curable polymer. However, the present disclosure is not limited thereto.

In an illustrative embodiment, forming an oxide layer or an insulating polymer layer on the graphene protective film coated on the flexible substrate may be further included. However, the present disclosure is not limited thereto.

In an illustrative embodiment, forming an adhesion layer between the graphene film and the oxide layer or between the graphene film and the insulating polymer layer may be further included. However, the present disclosure is not limited thereto.

In an illustrative embodiment, transferring the graphene film on the flexible substrate to coat the flexible substrate with the graphene film may be performed more than one time. However, the present disclosure is not limited thereto.

In an illustrative embodiment, the graphene film may include the graphene film containing from monolayer to 100 layers of graphene. However, the present disclosure is not limited thereto.

The flexible barrier sheet in accordance with another aspect of the present disclosure comprises a graphene protective film serving as a gas and moisture barrier including a graphene film formed on a flexible substrate.

In an illustrative embodiment, the graphene protective film serving as a gas and moisture barrier may be produced by the above-described forming method of the graphene protective film serving as a gas and moisture barrier in accordance with the present disclosure. However, the present disclosure is not limited thereto.

In an illustrative embodiment, the flexible substrate may include a plastic substrate, a substrate for an organic light emitting diode (OLED), or a sheet for a food and beverage container. However, the present disclosure is not limited thereto.

In an illustrative embodiment, the graphene protective film serving as a gas and moisture barrier may further include a metal layer between the flexible substrate and the graphene film. However, the present disclosure is not limited thereto. The metal layer is a catalyst layer formed to facilitate growth of the graphene film on the flexible substrate and may be at least one metal or alloy selected from the group consisting of Ni, Co, Fe, Pt, Au, Al, Cr, Cu, Mg, Mn, Mo, Rh, Si, Ta, Ti, W, U, V, Zr, brass, bronze, white brass, stainless steel, and Ge. However, the present disclosure is not limited thereto.

In an illustrative embodiment, the graphene protective film serving as a gas and moisture barrier may be formed by a method including forming a metal layer on the flexible substrate and supplying heat and a reaction gas containing a carbon source to the metal layer to form the graphene layer. However, the present disclosure is not limited thereto. In an illustrative embodiment, the flexible substrate may include polyimide (PI), polyethersulfon (PES), polyetheretherketone (PEEK), polyethyleneterephthalate (PET), or polycarbonate (PC). However, the illustrative embodiment is not limited thereto.

In an illustrative embodiment, the graphene film may be formed by a method of plasma-enhanced chemical vapor deposition. In this case, the production of the graphene film may be performed at a temperature of about from 100° C. to about 600° C. However, the present disclosure is not limited thereto.

Still another aspect of the present disclosure provides an item comprising the above-described flexible barrier sheet of the present disclosure.

In an illustrative embodiment, the item may include an electronic device, a photoelectronic device, an optical device, a light emitting device, an organic light emitting diode (OLED), an organic semiconductor device, a LCD display, a solar device, a thin film sensor, or a food and beverage container. However, the present disclosure is not limited thereto.

All the descriptions of the forming method of the graphene protective film serving as a gas and moisture barrier may be applied to the flexible barrier sheet and the item including the flexible barrier sheet. For convenience in descriptions, overlapping descriptions will be omitted.

Hereinafter, the graphene protective film having a gas and moisture blocking property and the forming method of the graphene protective film in accordance with the present disclosure will be described in detail with reference to illustrative embodiments and examples. However, the present disclosure is not limited thereto.

With reference to FIG. 1, the forming method of the graphene protective film having a gas and moisture blocking property in accordance with the present disclosure includes: producing a graphene film on a substrate by supplying heat and a reaction gas containing a carbon source to the substrate; and transferring the graphene film on a flexible substrate by a dry process, a wet process, or a roll-to-roll process to coat the flexible substrate. If necessary, as shown in FIG. 1, an organic supporting layer such as a stamper or a thermal release tape may be further formed on the graphene film after the production of the graphene film on the substrate.

Through the above-described processes, the forming method of the graphene protective film serving as a gas and moisture barrier in accordance with the present disclosure enables a large scale graphene film to be easily coated on the flexible substrate under an atmosphere of a normal pressure without requiring a vacuum process. Further, the graphene protective film can be formed within a short time at low costs. The graphene protective film serving as a gas and moisture barrier formed through the above-described processes is formed on the flexible substrate, and then a flexible barrier film, which is flexible, and has an excellent mechanical characteristic and an improved gas and moisture blocking property, can be obtained. The flexible substrate may be a plastic substrate, a food and beverage container (sheet), an OLED thin film device, or the like. As described above, the graphene film may be coated on various devices to improve the gas and moisture blocking property of the devices, so that the improved electrical characteristic of the devices can be maintained for a long time. If the flexible substrate is a food and beverage container (sheet), the graphene film may be coated on surfaces of various food and beverage containers, so that the characteristics of the food and beverage can be preserved for a long time.

The graphene film formed on the substrate may be transferred and coated on the flexible substrate through various processes. Any coating method may be used without limitation if the method is generally used in the art to transfer a graphene film on a substrate and coat the substrate with the graphene film. For example, a dry process, a wet process, a spray process, or a roll-to-roll process may be used.

A wet coating process and a roll-to-roll coating process will be more specifically described with reference to FIG. 1. The wet coating process includes immersing the substrate 10, on which the graphene film 20 is formed, in an etching solution 60 to selectively remove or separate only the substrate 10 thereby floating the graphene film 20, and introducing the flexible substrate 32 from an upper direction or a lower direction of the floated graphene film to transfer and coat the graphene film on the flexible substrate 32. More specifically, the flexible substrate is introduced from the upper direction of the floated graphene film to stamp the graphene film on the flexible substrate, or the flexible substrate is floated from the lower portion of the floated graphene film, i.e., from the interior of the etching solution, to coat the graphene film on the flexible substrate.

A stamper or a thermal release tape may be further formed as an organic supporting layer 31 on the graphene film. As the stamper, any stamper known in the art may be used without limitation. For example, the stamper may be a stamper formed of various polymers such as PDMS, PMMA, polystyrene, PVC, polybutadiene, SBS rubber, or polyurethane. However, the present disclosure is not limited thereto. In case of using the stamper, if necessary, a process for removing the stamper may be further performed after the formation of the graphene protective film. FIG. 1 illustrates the forming method of the graphene protective film using the stamper. However, the graphene protective film may be formed by only coating the graphene film on the flexible substrate without using the stamper.

A process for cleaning the graphene protective film with a distilled water and drying the graphene protective film may be further performed after the coating of the graphene protective film on the flexible substrate. The drying process is performed at about 70° C. for more than about 30 minutes. Through the drying process, the adhesion of the graphene protective film can be improved.

Another illustrative embodiment for coating the graphene protective film on the flexible substrate may include forming the graphene film on one surface of the flexible substrate through a spray method. In accordance with an illustrative embodiment, the spray method may include a method of dispersing the graphene film in a proper solvent to disperse the graphene film on the flexible substrate. As the solvent, any solvent may be used without limitation if the graphene film can be dispersed in the solvent. For example, the solvent may include water or an organic solvent such as alcohol. However, the present disclosure is not limited thereto.

Still another illustrative embodiment for coating the graphene protective film on the flexible substrate may include forming the graphene protective film on the flexible substrate through a roll-to-roll process. The roll-to-roll process may be performed only for the process for the coating with the graphene film as illustrated in FIG. 1, or for all the processes including forming the graphene film on the substrate, etching the substrate, and coating the graphene film, from which the substrate is removed, on the flexible substrate. If the roll-to-roll process is used, the production process is simplified so that a large scale graphene protective film can be coated on the flexible substrate within a short time.

In order to further reduce the gas and moisture transmittance, a monolayer or multilayer graphene film may be coated on the flexible substrate, by repeating the transferring process. The multilayer graphene film is stacked by the van der Waals force. As an unlimited example, the graphene film may be adjusted in a range of 1 to 100 layers by repeating the above-described roll-to-roll coating process for the graphene film. The multilayer graphene film can remedy the deficit of the monolayer graphene film. In order to stably drive an OLED device sensitive to moisture or a gas, or if the graphene film is used as a sealing film, the multilayer graphene film is preferably used. For example, if the multilayer graphene film is formed by the roll-to-roll coating process, the multiplayer graphene film can be formed by simply repeating the roll-to-roll process. By coating the multilayer graphene film on the flexible substrate, the gas and moisture blocking property of the flexible substrate can be improved.

Figure 3A:
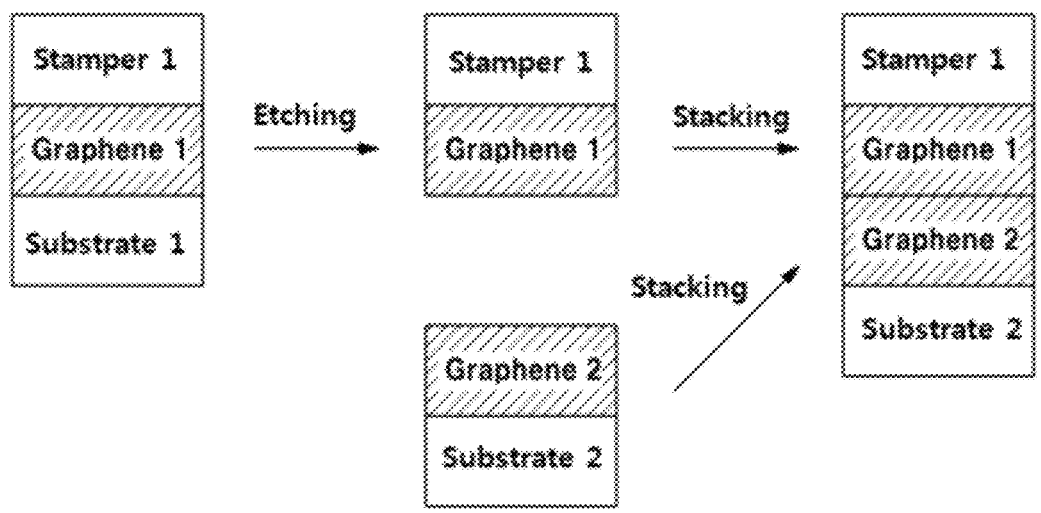
FIGS. 3A and 3B are cross-sectional views showing forming a multilayer graphene film by using an organic support layer in accordance with illustrative embodiments of the present disclosure.
Figure 3B:
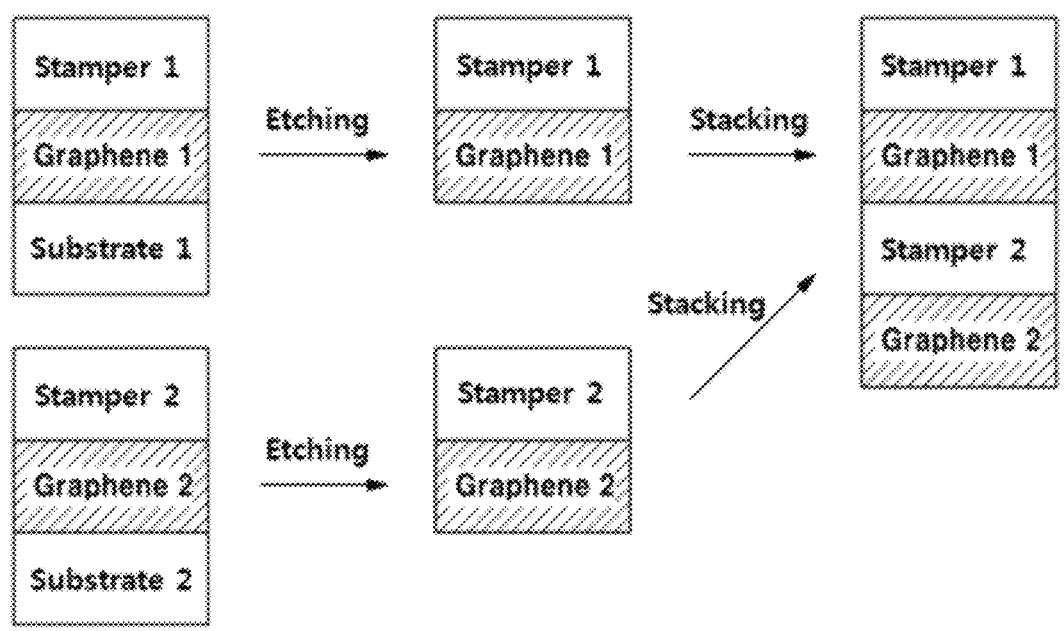

An unlimited example for forming the multilayer graphene film may use a stamper. For example, as shown in FIG. 3A, the multilayer graphene film may be formed by stacking graphene (Graphene 1), from which a substrate is removed, and a stamper (Stamper 1) on the graphene directly onto another graphene (Graphene 2), without transferring Graphene 1 and Stamper 1 onto another stamper. As shown in FIG. 3B, the multilayer graphene film may be formed through a method of transferring a graphene (Graphene 1), from which a substrate is removed, and a stamper (Stamper 1) on the graphene onto another stamper (Stamper 2), and then, removing Stamper 1 and Stamper 2. In case of stacking the produced graphene directly on another graphene, rather than on a stamper as shown in FIG. 3A, residuals of the stamper can be minimized. Further, since no stamper exists between the graphene films, the multilayer graphene film may be formed by removing only the stamper existing on the uppermost layer of the graphene films through high temperature heat processing.

If necessary, an oxide layer or a polymer insulating layer may be further formed on the graphene protective film on the flexible substrate. The oxide layer or the polymer insulating layer is used to further improve the moisture and/or oxygen blocking property of the graphene protective film. For example, if the polymer insulating layer is further formed on the graphene protective film, the polymer insulating layer can block the conductivity of the graphene film and prevent mechanical release.

Figure 4A:
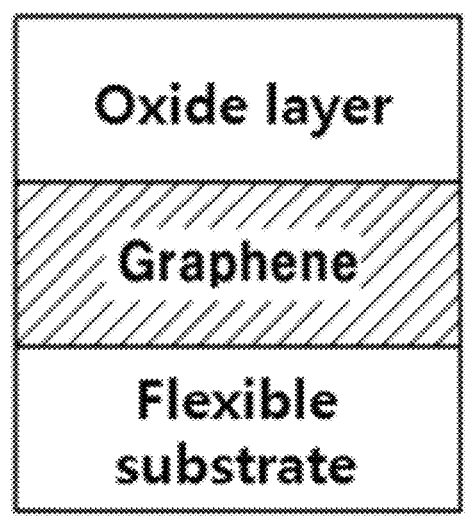
FIGS. 4A, 4B, and 4C are cross-sectional views of flexible barrier sheets, in which an oxide layer is formed on a graphene film, in accordance with illustrative embodiments of the present disclosure
Figure 4B:
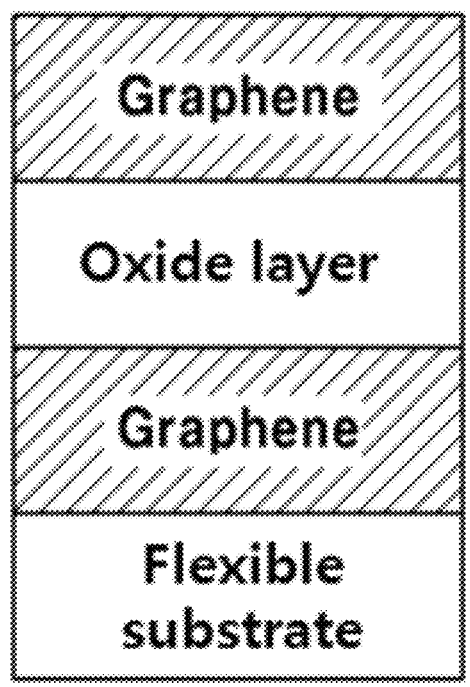

The oxide layer (FIG. 4A) further formed on the graphene protective film is used as a supplementary material to remedy deficits of the graphene film and reduce the gas and moisture transmittance. As the oxide layer, any material may be used without limitation if the material is generally used in the art to reduce the gas and moisture transmittance. For example, various oxide based materials such as $Al_2O_3$, $SiO_2$, $SnO_2$, $AlO_xN_x$ may be used. If necessary, the graphene protective film and the oxide layer may be alternatively stacked as shown in FIG. 4B. In one example, in coating two graphene films on a flexible PET substrate, an $Al_2O_3$ layer is formed as the oxide layer between the two graphene layers. FIG. 4D shows results obtained from measurement of transmittance of the graphene protective film produced by the above-described method.

Figure 4C:
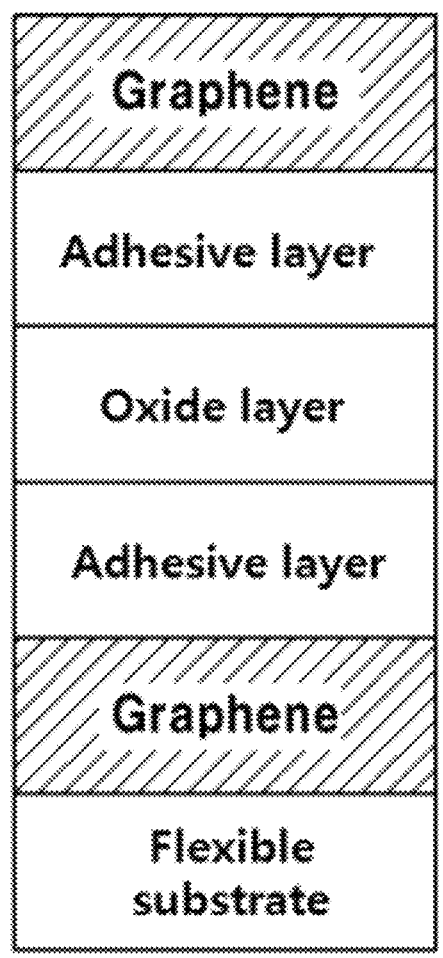
Figure 4D:
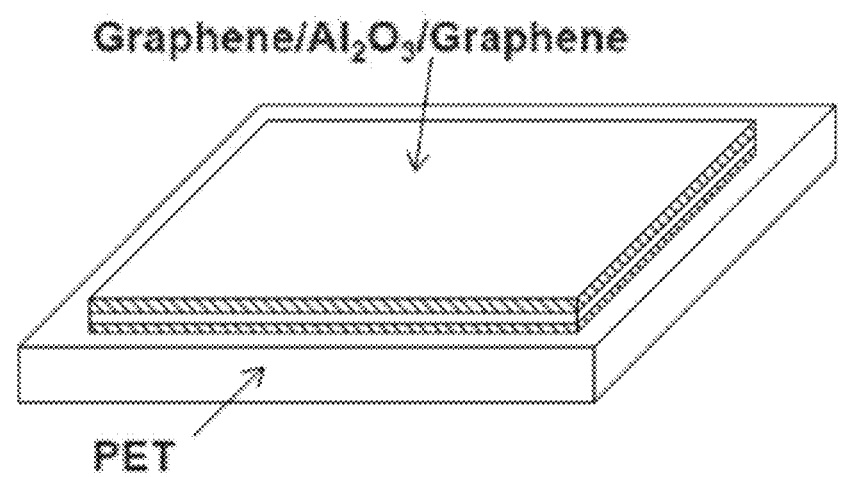
FIG. 4D is a result obtained from measurement of transmittance of the graphene protective film in accordance with an illustrative embodiment of the present disclosure.
Figure 4D:
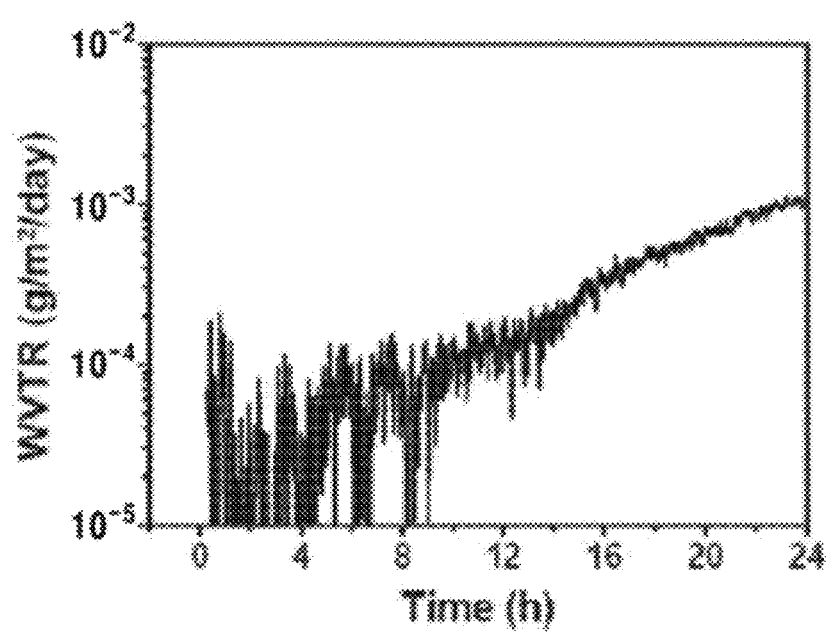

In order to improve the adhesion between the graphene film and the oxide layer or between the graphene film and the polymer insulating layer, an adhesion layer may be further formed between the graphene film and the oxide layer or between the graphene film and the polymer insulating layer (FIG. 4C). For example, the adhesion layer may be an organic adhesion layer including an adhesive polymer or the like. However, the present disclosure is not limited thereto.

A method for forming the oxide layer or the polymer insulating layer and thickness of the oxide layer or the polymer insulating layer are not limited. Examples of the method for forming the oxide layer or the polymer insulating layer may include a sputtering method, an atomic layer deposition (ALD) method, a chemical vapor deposition method, or others. Through the method, an oxide layer or a thin film having thickness of from several nanometers to several hundred nanometers can be formed.

In order to improve adhesion and/or separation between the flexible substrate and the graphene film, an adhesive layer may be further formed between the flexible substrate and the graphene film. For example, the adhesive layer may include a thermal release polymer, low density polyethylene, a low molecular polymer, or an ultraviolet or infrared ray curable polymer. However, the present disclosure is not limited thereto. Specifically, as the adhesive layer, PDMS, various known poly urethane based films, or others may be used. A water system adhesive, which is an environment-friendly adhesive, an aqueous adhesive, a vinyl acetate emulsion adhesive, a hot melt adhesive, a photo-curable (UV, visible light, electron beam, and UV/EB curable) adhesive, a photo-softening (UV, visible light, electron beam, and UV/EB softening) tape, or others also may be used. However, the present disclosure is not limited thereto. As the adhesive layer, polybenizimidazole (PBI), polyimide (PI), silicone/imide, bismaleimide (BMI), a modified epoxy resin, or others, which is a high heat resistance adhesive, may be used. However, the present disclosure is not limited thereto. The adhesive layer may include a general adhesive tape, glue, an epoxy resin, a photo-softening (UV, visible light, electron beam, and UV/EB) tape, a thermal release tape, or an aqueous tape. However, the present disclosure is not limited thereto. The adhesive layer that can be formed by using the above-described materials facilitates the adhesion and/or separation of the graphene.

As the etching solution used in the process for coating the graphene film, any solution may be used without limitation if the solution is generally used in the art to selectively remove or separate the substrate. For example, the etching solution may be a solution including ammonium persulfate $(NH_4)_2S_2O_8$, HF, BOE, $Fe(NO_3)_3$, iron chloride (Iron(III) Chloride, $FeCl_3$), or $CuCl_2$. However, the present disclosure is not limited thereto.

The substrate, on which the graphene grows, may exist solely or further include a catalyst layer (not illustrated). Materials for the substrate are not limited. For example, the materials for the substrate may include at least one metal or alloy selected from the group consisting of Ni, Co, Fe, Pt, Au, Al, Cr, Cu, Mg, Mn, Mo, Rh, Si, Ta, Ti, W, U, V, Zr, brass, bronze, white brass, stainless steel, and Ge. If the substrate is metal, the substrate itself may function as a catalyst for forming the graphene film. However, the material for the substrate does not have to be metal. For example, silicon may be used as the material for the substrate. A silicon substrate may be oxidized to form a catalyst layer on the silicon substrate, such that the substrate, on which a silicon oxide layer is further formed, can be used.

The catalyst layer may be further formed to facilitate the growth of the graphene film on the substrate. Materials, thickness, and a shape of the catalyst layer are not limited. For example, the catalyst layer may be at least one metal or alloy selected from the group consisting of Ni, Co, Fe, Pt, Au, Al, Cr, Cu, Mg, Mn, Mo, Rh, Si, Ta, Ti, W, U, V, Zr, brass, bronze, white brass, stainless steel, and Ge. The catalyst layer may be formed of a material identical to or different from the material for the substrate. The thickness of the catalyst layer is not limited and may be a thin or thick film.

As the method for forming the graphene film on the substrate, any method can be used without limitation if the method is generally used in the art to grow the graphene. For example, a chemical vapor deposition method may be used. However, the present disclosure is not limited thereto. The chemical vapor deposition method may include rapid thermal chemical vapour deposition (RTCVD), inductively coupled plasma-chemical vapor deposition (ICP-CVD), low pressure chemical vapor deposition (LPCVD), atmospheric pressure chemical vapor deposition (APCVD), metal organic chemical vapor deposition (MOCVD), and plasma-enhanced chemical vapor deposition (PECVD). However, the present disclosure is not limited thereto.

The process for growing the graphene film may be performed under a normal pressure, a low pressure, or vacuum. For example, if the process is performed under the condition of a normal pressure, helium (He) or the like may be used as a carrier gas to minimize damage to the graphene caused by collision with heavy argon (Ar) at a high temperature. Also, if the process is performed under the condition of a normal pressure, a large scale graphene film can be produced through a simple process at low costs. If the process is performed under the condition of a low pressure or vacuum, hydrogen ($H_2$) may be used as an atmosphere gas while increasing a temperature, so that an oxidized surface of a metal catalyst is reduced, and high quality graphene can be synthesized.

The graphene film formed by the above-described method may have a large scale with a horizontal and/or vertical length of more than about 1 mm to about 1,000 m. The graphene film has a homogeneous structure with little deficits. The graphene film formed by the above-described method may include monolayer or multilayer graphene. As an unlimited example, thickness of the graphene film may be adjusted in a range of 1 or 100 layers.

In an illustrative embodiment for forming the graphene film on the substrate, the graphene film may be grown by putting a metal substrate of a thin film or foil form into a tube-shaped furnace, supplying a reaction gas containing a carbon source, and performing heat processing at a normal pressure. If a heat processing is performed in a range of, for example, from about 300° C. to about 2000° C. while the carbon source such as carbon monoxide, carbon dioxide, methane, ethane, ethylene, ethanol, acetylene, propane, butane, butadiene, pentane, pentene, cyclopentadiene, hexane, cyclohexane, benzene, toluene is supplied in the form of gas, carbon components contained in the carbon source are combined with each other to form a hexagonal plate structure and the graphene layer can be grown.

In order to produce the flexible barrier sheet including graphene protective film serving as a gas and moisture barrier, the method for forming the graphene film on the substrate, and transferring the graphene film onto the flexible substrate to coat the flexible substrate has been described. In another illustrative embodiment, the flexible barrier sheet may be produced by growing the graphene film directly on the flexible substrate without performing the transferring process.

If the graphene film is grown directly on the flexible substrate, the flexible substrate is preferably a flexible plastic substrate such as polyimide (PI), polyethersulfon (PES), polyetheretherketone (PEEK), polyethyleneterephthalate (PET), or polycarbonate (PC). In order to facilitate the growth of the graphene film on the flexible plastic substrate, a metal layer may be further included. In this case, the metal layer is not removed and left on the flexible plastic substrate, so that the metal layer itself can function as a barrier layer, thereby improving a gas and moisture blocking effect. If transparency is required, the metal layer is formed as a thin film layer with several nanometers or several tens of nanometers, so that the transparency of the flexible barrier substrate can be improved. If transparency is not required, the metal layer may be formed to be thick, so that the gas and moisture blocking effect can be improved. As the method for forming the graphene film on the flexible plastic substrate or the metal layer of the flexible plastic substrate, any of the above-described chemical vapor deposition methods may be used. More preferably, the method may be performed by the plasma chemical vapor deposition method at a low temperature of from about 100° C. to about 600° C. The method for producing the flexible barrier substrate by growing the graphene film directly on the flexible substrate can reduce deficits of the graphene film, which may be generated in the process of transferring the graphene film formed on the substrate onto the flexible substrate. Furthermore, since the metal layer itself is used as a barrier layer, the gas and moisture blocking property of the flexible barrier substrate can be improved.

Hereinafter, the present disclosure will be described in more detail with reference to examples. However, the present disclosure is not limited to the examples.

Example 1

Graphene Protective Film Coating Through the Wet Process

In a process for growing graphene using chemical vapor deposition, a copper substrate was heated to 1,000° C. in an atmosphere of a 10 sccm $H_2$ gas and 160 mTorr, and then, subjected to heat processing in the same atmosphere for 30 minutes. Thereafter, a mixture gas of 30 sccm methane and sccm hydrogen flowed at a 1.6 Torr pressure for 30 minutes, and then the mixture gas was rapidly cooled to a room temperature in an atmosphere of a 10 sccm hydrogen gas and 160 mTorr. In a process for transferring the graphene film on the copper substrate onto a plastic film, an organic support layer such as a thermal release tape or PMMA was adhered onto the graphene film grown on the copper substrate. After the cooper substrate was removed by an etching solution, the remaining graphene film was adhered to the organic support layer. In this state, the graphene film could be transferred to the plastic substrate. Through the wet coating method, transfer of the graphene film was performed by raising the plastic substrate up to the graphene film floating on water. After the wet coating, the PMMA layer was removed by acetone.

In order to produce a multilayer graphene film, the graphene produced by the above-described method was not transferred to another PMMA layer, and was transferred directly onto another graphene formed on the copper substrate, so that residuals of PMMA could be minimized, and the number of coatings of PMMA could be reduced. Since no PMMA exists between the graphene films forming multiple layers, the multiple graphene film could be formed by only removing a stamper existing on the uppermost layer of the graphene films through high temperature heat processing (refer to FIG. 3). The multilayer graphene film produced by the above-described method exhibited reduced microcracks.

Figure 5A:
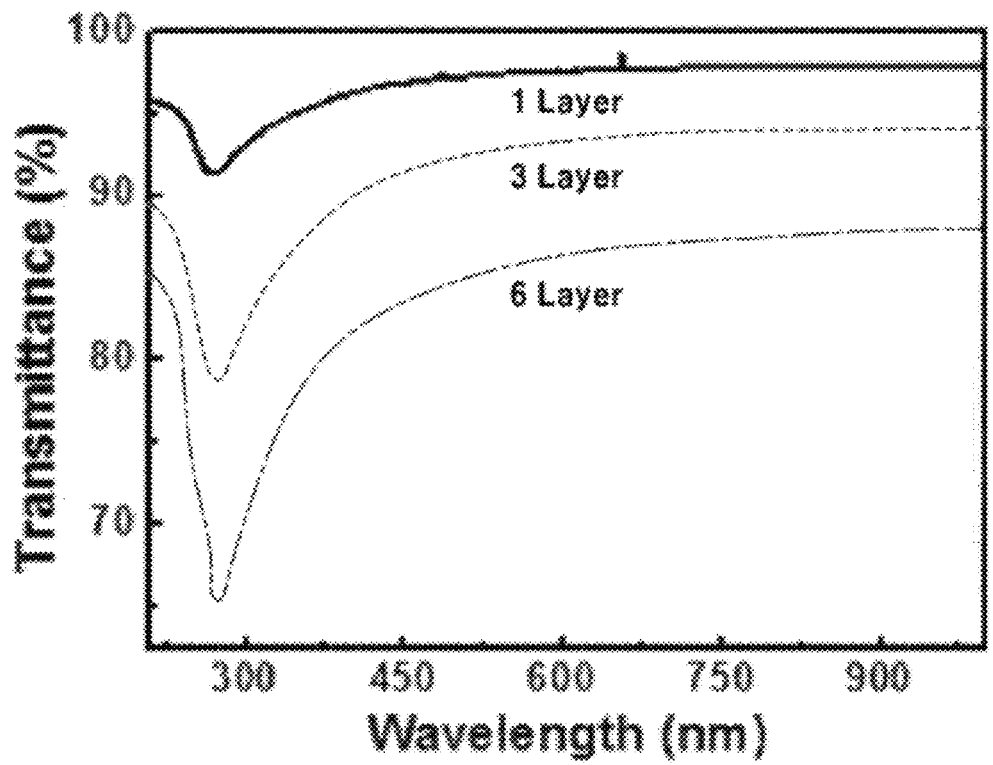
FIG. 5A is a graph showing light transmittance of a quartz substrate coated with a graphene film and FIG. 5B is a Raman spectrum of a $SiO_2$ substrate coated with a graphene film in accordance with an illustrative embodiment of the present disclosure.
Figure 5B:
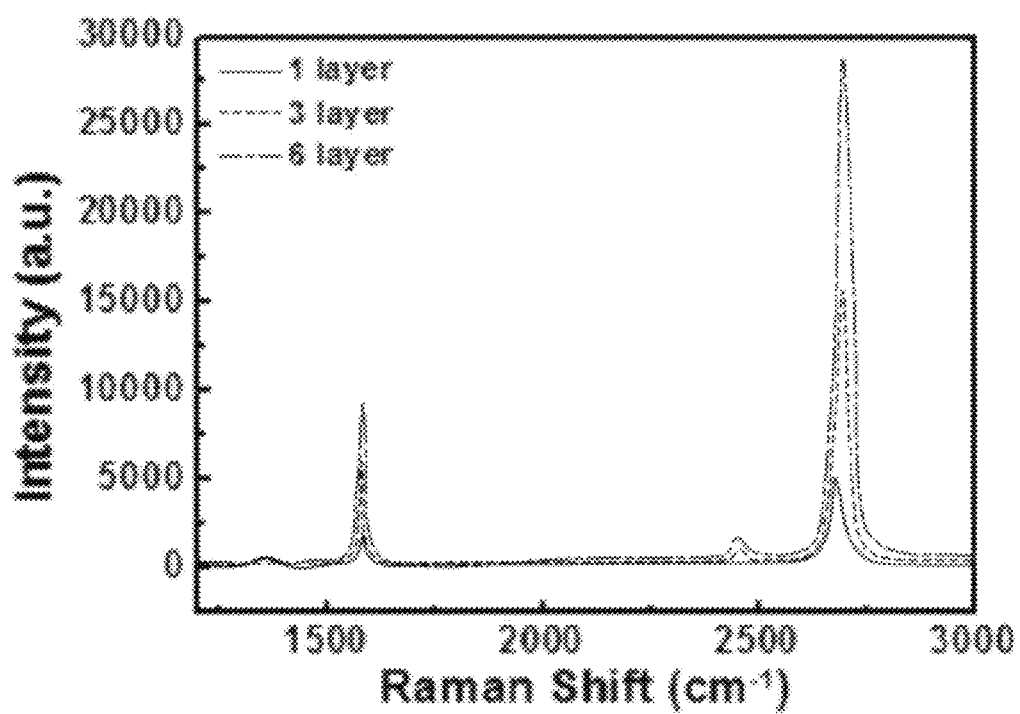

FIG. 5A shows light transmittance depending on thickness of a graphene film formed on a quartz substrate through the wet process. Light transmittance of two films was about 93% and about 86% in case of 550 nm, respectively. Since light transmittance for one layer of graphene is about 2.3%, the above-described light transmittance corresponds to transmittance of about 3 and 6 layers, respectively. FIG. 5B is a graph showing Raman spectrum data for a graphene film formed on a $SiO_2$ substrate through the wet process, in which measurement was performed by varying the number of layers of the graphene film to be 1, 3, and 6 layers. As the number of layers of the graphene film increases, intensity of G and 2D bands increases proportionally, and variation in the proportions of the two bands was not remarkable. This result is distinguished from a graphene film extracted from graphite and having a multilayer structure in a stacking order of ABAB. Thus, the monolayer graphene is having a fundamental characteristics of graphene film, which is stacked with arbitrary direction.

Figure 6A:
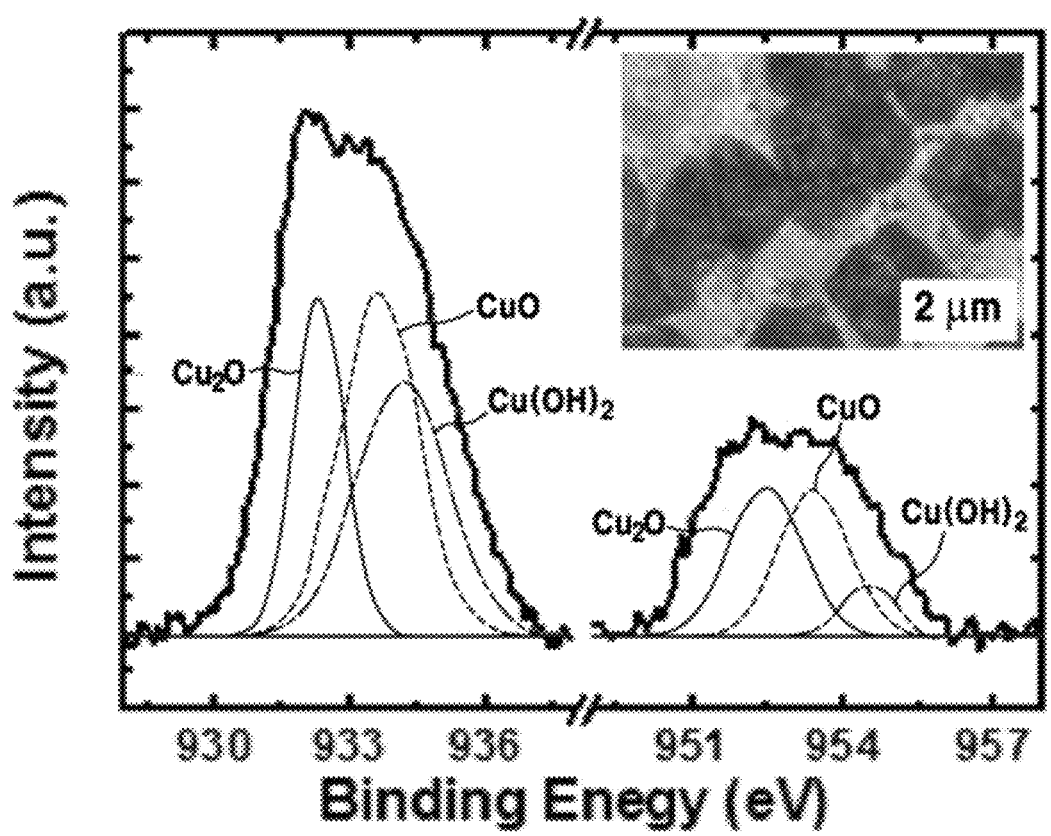
FIGS. 6A and 6B are graphs obtained from measurement of characteristics of a pure copper substrate and a copper substrate coated with a graphene film.
Figure 6B:
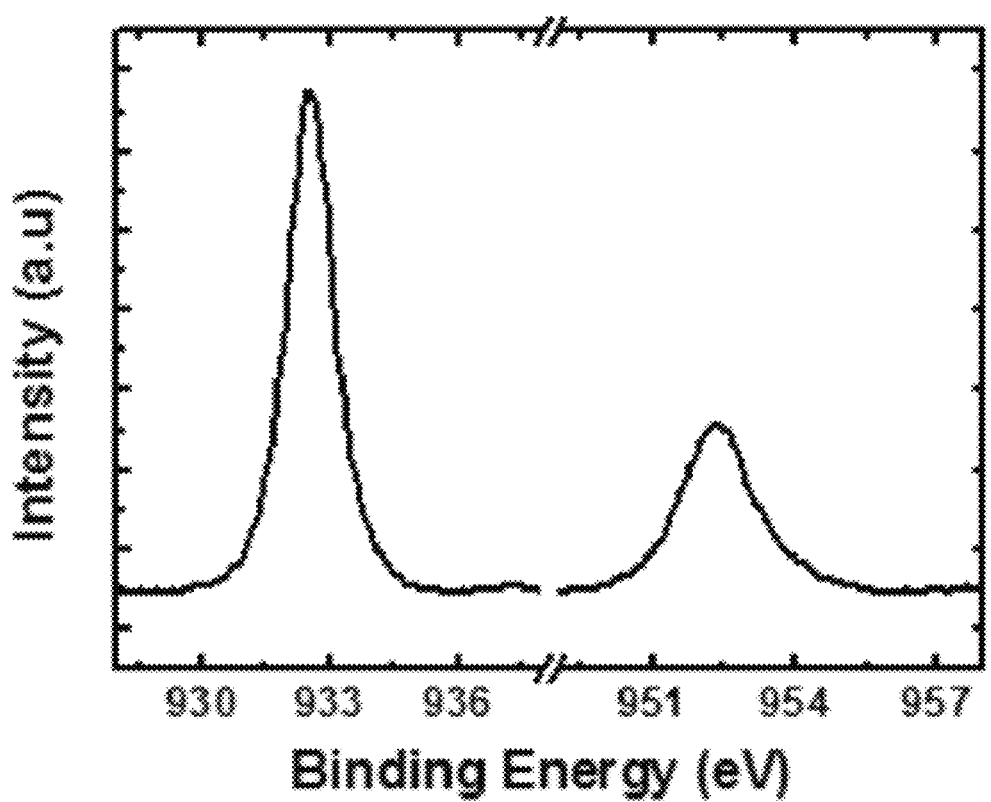

The copper substrate, on which graphene is grown through the above-described method, was kept in an atmosphere of a high temperature and a normal pressure for 2 months, and the surface of the copper substrate was analyzed. The copper substrate, on which no graphene exists, had a visibly changed surface after oxidization, whereas the copper substrate, on which graphene is grown, had an unchanged surface after the oxidization process. This shows that the graphene film existing on the surface effectively prevents oxidization of the copper substrate from oxygen gases. After the oxidization process, the surface of the copper substrate was subject to chemical analysis through XPS analysis. With reference to FIG. 6A, XPS spectrum exhibited peaks [$Cu_2O$ (binding energy of 932.4 and 952.4 eV), CuO (933.6 and 953.4 eV), and $Cu(OH)_2$ (934.3 and 954.5 eV)] of movement of the pure copper substrate due to the oxidization. With reference to FIG. 6B, in case of the copper substrate, on which the graphene protective film is grown, distribution of two peaks corresponded only to 932.6 eV and 952.4 eV. This suggests that the graphene film can be used as an oxidization prevention film. Furthermore, it shows the possibility that the graphene film can be used as an oxygen and moisture barrier of a plastic film.

Figure 7A:
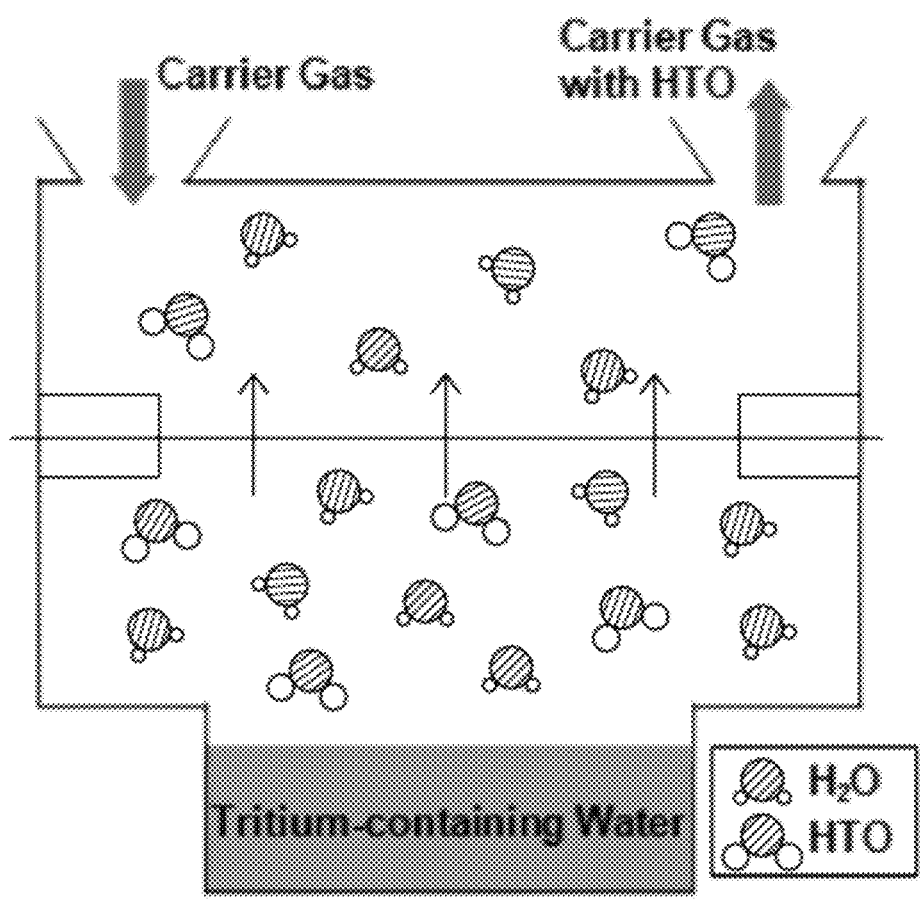
FIGS. 7A and 7B are an image of experimental methods and a graph of results for a degree of moisture transmittance of a graphene film in accordance with an example of the present disclosure.
Figure 7B:
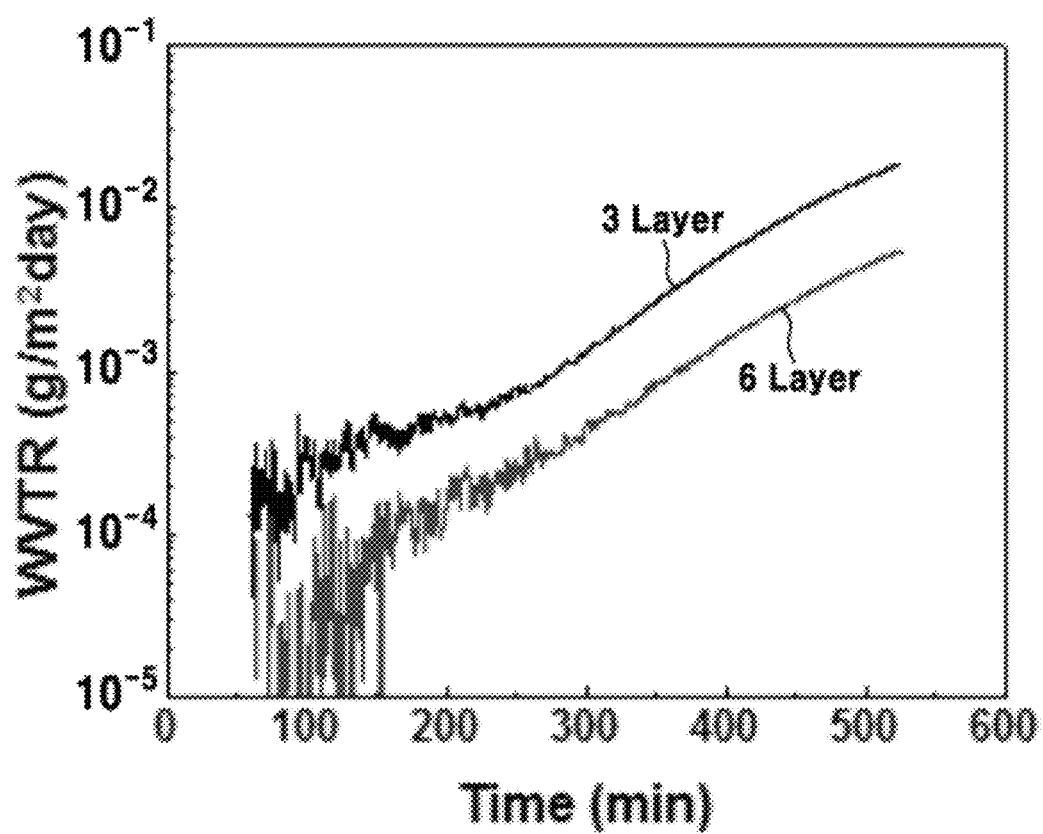

In order to verify the possibility that the graphene film can be used as an oxygen and moisture barrier, moisture transmittance of PET coated with the graphene film was measured by using water (HTO) containing tritium, which is a radioactive isotope with water. As shown in FIG. 7A, a PET film covered with the graphene film was positioned in a middle portion of the space. HTO molecules penetrated the graphene film and were carried to a beta-ray detector. Such a measurement system could measure the transmittance up to a transmittance level of about $10^{-6}$ $g/m^2/day$. FIG. 7B shows results obtained from measurement of moisture transmittance of the PET film coated with the graphene film having 3 and 6 layers through the same method as in FIG. 7A. For the graphene films having 3 layers (thickness: ~1.2 nm) and 6 layers (thickness: ~2.4 nm), about $10^{-3}$ $g/m^2/day$ and about $10^{-4}$ $g/m^2/day$ of moisture transmittance were measured for initial 5 hours, respectively. This result exhibits more excellent characteristics than initial data of a conventional monolayer inorganic barrier film. The conventional monolayer inorganic barrier film may be $SiO_2$ or $Al_2O_3$. For example, transmittance of $SiO_2$ deposited through PECVD and having a thickness of 100 nm and $Al_2O_3$ deposited through ALD and having a thickness of 30 nm are about 0.2 and $6 \times 10^{-3}$ $g/m^2/day$, respectively.

Example 2

Graphene Protective Film Coating Through the Roll-to-Roll Process

1. Growth of a Large Scale Graphene Film on a Copper Substrate

A substrate (thickness: 25 μm; size: 210×297 $mm^2$; Alfa Aesar Co.) in a roll shape of Cu was loaded into a quartz tube having from 1 to 8 inch diameter. Thereafter, the substrate was heated to 700° C. to 1,000° C. under a normal pressure. A gas mixture ($CH_4:H_2:Ar=50:65:200$ sccm) containing a carbon source was supplied to grow graphene on the Cu substrate. Thereafter, He flowed in a short time to cool the substrate to a room temperature at a cooling rate of ~10° C./s, so that a graphene film grown on the Cu substrate was obtained.

Figure 8:
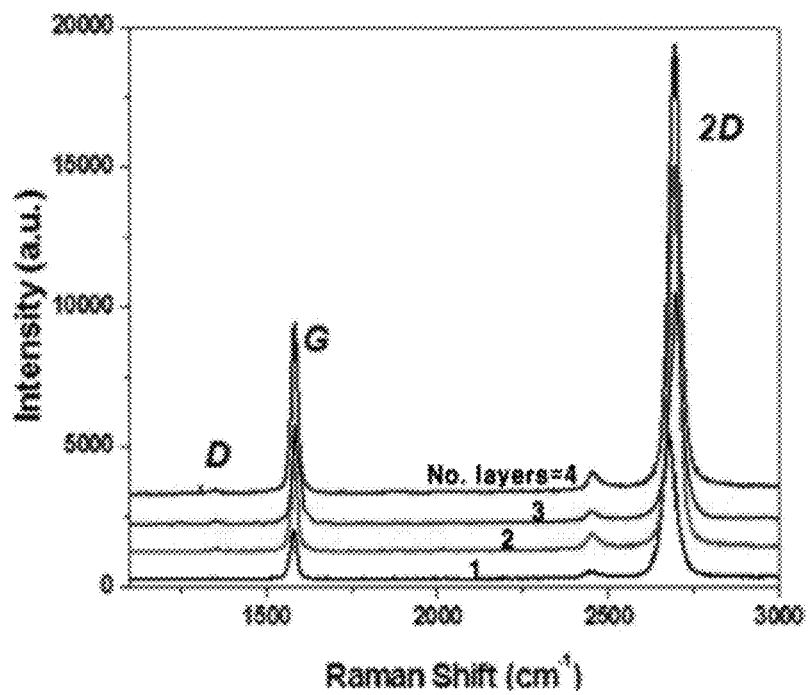
FIG. 8 is a graph showing light transmittance of a quartz substrate coated with a graphene film and a Raman spectrum of a $SiO_2$ substrate coated with a graphene film in accordance with another example of the present disclosure.
Figure 8:
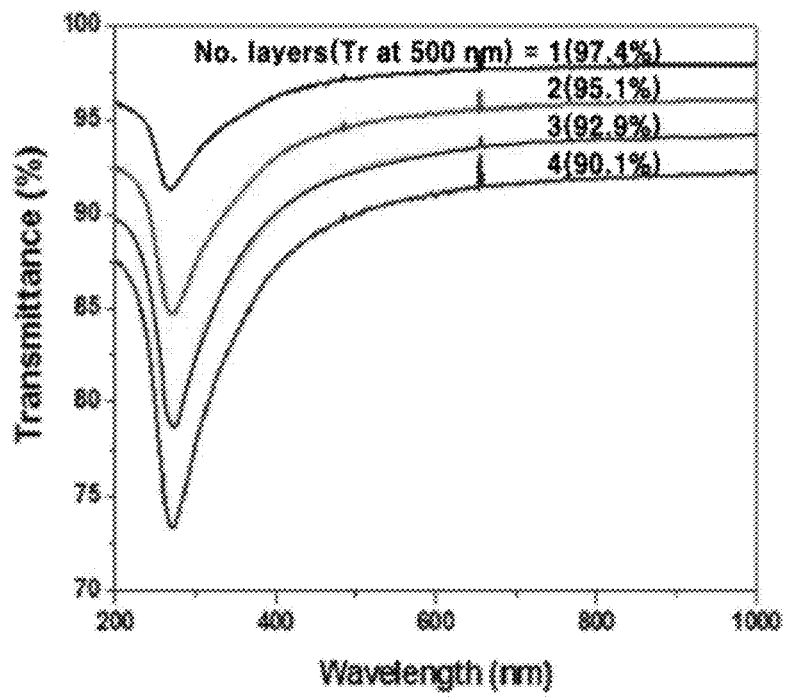

2. A Process for Coating a Graphene Protective Film Through the Roll-to-Roll Process Thereafter, each of a quartz substrate, and a $SiO_2$ substrate, on which an adhesive layer is formed, was contacted on the graphene film formed on the Cu substrate to pass through a roller to be adhered to one another. Next, the Cu substrate/graphene film/substrate layered structure was immersed in a 0.5 M $FeCl_3$ etching solution to etch and remove the Cu substrate through electro-chemical reaction. As a result, the graphene film was transferred onto the substrate to form the graphene protective film. FIG. 8 shows results obtained from observation of light transmittance depending on the thickness of the graphene film formed on the quartz substrate and Raman spectrum data of the graphene film formed on the $SiO_2$ substrate.

Figure 9:
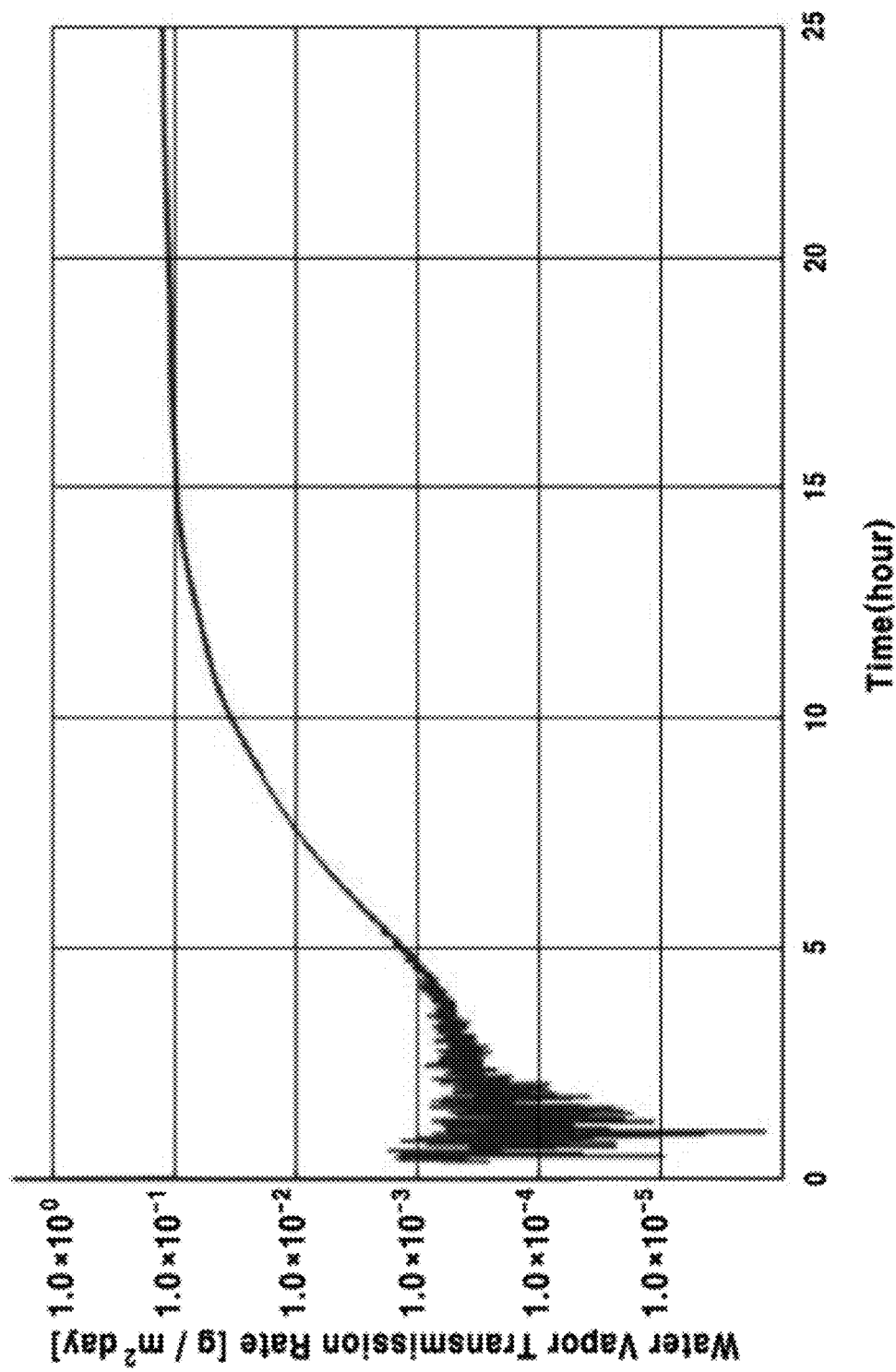
FIG. 9 is a graph showing a degree of moisture ($H_2O$) transmittance of a graphene film coated on a flexible PET substrate through a roll-to-roll process.

FIG. 9 shows experimental results of moisture ($H_2O$) transmittance (WVTR) of the graphene film (3 layers) formed on the quartz substrate. The moisture ($H_2O$) transmittance of the pure quartz substrate, on which no graphene film is formed, was 10 $g/m^2/day$, whereas the moisture ($H_2O$) transmittance of the quartz substrate, on which 3 layers of graphene are stacked, was remarkably reduced to $10^{-3}$~$10^{-1}$ $g/m^2/day$.

The present disclosure has been described with reference to preferable examples. However, it would be understood by those skilled in the art that the protection scope of the present disclosure is not limited to the foregoing examples, and that various changes and modifications to the present disclosure can be made without departing from the technical concept and area of the present disclosure.

What is claimed is:

1. A flexible barrier sheet having a length and width and comprising:
   a graphene protective film comprising at least two graphene layers, each of the at least two graphene layers being a monolayer of covalently bonded carbon atoms having a uniform thickness across the length and the width of the flexible barrier sheet;
   a flexible substrate on a first side of the graphene protective film;
   an insulating polymer layer on a second and opposite side of the graphene protective film;
   a first adhesion layer between the graphene protective film and the flexible substrate; and,
   a second adhesion layer between the graphene protective film and the insulating polymer layer,
   wherein the graphene protective film blocks the penetration of gas and moisture through the graphene protective film, and a moisture transmittance of the graphene protective film ranges from $10^{-4}$ $g/m^2/day$ to $10^{-1}$ $g/m^2/day$, and
   wherein the insulating polymer layer blocks the conductivity of graphene protective film.

2. The flexible barrier sheet of claim 1, wherein the graphene protective film is produced by a method including producing each layer of the at least two graphene layers on a temporary substrate by supplying heat and a reaction gas containing a carbon source to the temporary substrate; and transferring a first graphene layer of the at least two graphene layers onto the flexible substrate by a dry process, a wet process, or a roll-to-roll process to coat the flexible substrate with the at least two graphene layers; and transferring the second graphene layer of the at least two graphene layers on to the first graphene layer.

3. The flexible barrier sheet of claim 1, wherein the flexible substrate includes a plastic substrate, a substrate for an organic light emitting diode(OLED), or a sheet for a food and beverage container.

4. The flexible barrier sheet of claim 1, wherein the flexible substrate is selected from the group consisting of polyimide, polyethersulfone, polyetheretherketone, polyethyleneterephthalate, polycarbonate, and combinations thereof.

5. A flexible barrier sheet having a length and a width and comprising:
   a flexible substrate;
   a metal layer formed on the flexible substrate;
   a plurality of graphene layers formed on the metal layer, each of the graphene layers being a monolayer of covalently bonded carbon atoms having a uniform thickness across the length and the width of the flexible barrier sheet;
   an insulating polymer layer formed on a side of the plurality of graphene layers opposite the metal layer;
   an adhesion layer between the plurality of graphene layers and the insulating polymer layer;
   an adhesion layer between each successive layer of the graphene protective film; and,
   an adhesion layer between the plurality of graphene layers and the flexible substrate;
   wherein the barrier sheet blocks the penetration of gas and moisture through the barrier sheet, and a moisture transmittance of the flexible barrier sheet ranges from $10^{-4}$ $g/m^2/day$ to $10^{-1}$ $g/m^2/day$, and
   wherein the insulating polymer layer blocks the conductivity of plurality of graphene layers.

6. The flexible barrier sheet of claim 5, wherein the flexible substrate is selected from the group consisting of polyimide, polyethersulfone, polyetheretherketone, polyethyleneterephthalate, polycarbonate, and combinations thereof.

7. The flexible barrier sheet of claim 5, wherein each of the graphene layers is formed by supplying heat and a reaction gas containing a carbon source to the metal layer.

8. The flexible barrier sheet of claim 7, wherein each of the graphene layers is formed by a method of plasma-enhanced chemical vapor deposition (PECVD).

9. The flexible barrier sheet of claim 1, wherein the graphene protective film comprises at least three layers of graphene and wherein a light transmittance of the graphene film at 550 nm is between 86% and 93%.

10. The flexible barrier sheet of claim 6 wherein the plurality of graphene layers comprises at least three graphene layers and wherein a light transmittance of the graphene film at 550 nm is between 86% and 93%.

11. An item, comprising the flexible barrier sheet of claim 1.

12. The item of claim 11, wherein the item is an electronic device, a photoelectronic device, an optical device, an organic light emitting diode (OLED), an organic semiconductor device, an LCD display, a solar device, a thin film sensor, or a food and beverage container.

* * * * *